US010680124B2

(12) United States Patent
Darcie et al.

(10) Patent No.: US 10,680,124 B2
(45) Date of Patent: Jun. 9, 2020

(54) PLASMON-ENHANCED BELOW BANDGAP PHOTOCONDUCTIVE TERAHERTZ GENERATION AND DETECTION

(71) Applicant: UVic Industry Partnerships Inc., Victoria (CA)

(72) Inventors: Thomas E. Darcie, Victoria (CA); Reuven Gordon, Victoria (CA); Afshin Jooshesh, Victoria (CA)

(73) Assignee: UVic Industry Partnerships Inc., Victoria (CA)

( * ) Notice: Subject to any disclaimer, the term of this patent is extended or adjusted under 35 U.S.C. 154(b) by 0 days.

(21) Appl. No.: 15/775,709

(22) PCT Filed: Nov. 14, 2016

(86) PCT No.: PCT/US2016/061874
§ 371 (c)(1),
(2) Date: May 11, 2018

(87) PCT Pub. No.: WO2017/083840
PCT Pub. Date: May 18, 2017

(65) Prior Publication Data
US 2018/0374968 A1   Dec. 27, 2018

Related U.S. Application Data

(60) Provisional application No. 62/254,915, filed on Nov. 13, 2015.

(51) Int. Cl.
*H01L 31/0232* (2014.01)
*H01L 27/14* (2006.01)
(Continued)

(52) U.S. Cl.
CPC ........ *H01L 31/0232* (2013.01); *G01J 1/0407* (2013.01); *G01J 1/42* (2013.01);
(Continued)

(58) Field of Classification Search
CPC .......... G01J 1/0407; G01J 1/42; G01J 5/0837; G01J 5/28; H01L 27/14; H01L 27/144;
(Continued)

(56) References Cited

U.S. PATENT DOCUMENTS 3,970,958 A    7/1976  Streifer et al.
7,420,225 B1 *  9/2008  Wanke ................... B82Y 10/00
                                                  257/184
(Continued)

FOREIGN PATENT DOCUMENTS

JP    2007/079511    3/2007
JP    2007079511    3/2007

OTHER PUBLICATIONS

International Preliminary Report on Patentability from International Application No. PCT/US2016/061874, dated May 15, 2018, 10 pages.
(Continued)

*Primary Examiner* — Marcus H Taningco
(74) *Attorney, Agent, or Firm* — Klarquist Sparkman, LLP

(57) ABSTRACT

Disclosed are systems and methods for improving applications involving the generation and detection of electromagnetic radiation at terahertz (THz) frequencies. Embodiments of the systems and methods include the fabrication and use of plasmonic devices that enhance light-matter interaction at the nanometer scale by extreme focusing with nanostructured metals. This plasmonic enhancement is used to produce high efficiency THz photoconductive switches that combine the benefits of low-temperature grown GaAs while using mature 1.55 µm femtosecond lasers operating with photon energy below the GaAs band-gap.

30 Claims, 4 Drawing Sheets

Prior Art

(51) Int. Cl.
| | |
|---|---|
| *H01L 31/00* | (2006.01) |
| *G01J 5/08* | (2006.01) |
| *G01J 5/28* | (2006.01) |
| *G01J 1/04* | (2006.01) |
| *G01J 1/42* | (2006.01) |
| *H01L 27/144* | (2006.01) |
| *H01L 31/0304* | (2006.01) |
| *H01L 31/09* | (2006.01) |
| *H01Q 1/38* | (2006.01) |
| *H01Q 9/16* | (2006.01) |
| *H01Q 9/28* | (2006.01) |

(52) U.S. Cl.
CPC .............. *G01J 5/0837* (2013.01); *G01J 5/28* (2013.01); *H01L 27/14* (2013.01); *H01L 27/144* (2013.01); *H01L 31/00* (2013.01); *H01L 31/0304* (2013.01); *H01L 31/09* (2013.01); *H01Q 1/38* (2013.01); *H01Q 9/16* (2013.01); *H01Q 9/285* (2013.01)

(58) Field of Classification Search
CPC . H01L 31/00; H01L 31/0232; H01L 31/0304; H01L 31/09; H01Q 1/38; H01Q 9/16; H01Q 9/285
See application file for complete search history.

(56) References Cited

U.S. PATENT DOCUMENTS

| | | | |
|---|---|---|---|
| 9,105,791 B1* | 8/2015 | Dyer | .................. H01L 31/1127 |
| 2003/0223673 A1 | 12/2003 | Garito et al. | |
| 2008/0179528 A1 | 7/2008 | Demers | |
| 2008/0315098 A1 | 12/2008 | Itsuji | |
| 2009/0200472 A1 | 8/2009 | Gregory | |
| 2009/0262766 A1 | 10/2009 | Chen et al. | |
| 2012/0019901 A1 | 1/2012 | Mazumder | |
| 2012/0099827 A1 | 4/2012 | Rahman et al. | |
| 2014/0103211 A1 | 4/2014 | Darcie et al. | |
| 2014/0346357 A1 | 11/2014 | Jarrahi et al. | |
| 2014/0349357 A1 | 11/2014 | Nakamura et al. | |

OTHER PUBLICATIONS

International Search Report and Written Opinion from International Application No. PCT/US2016/061874, dated Apr. 10, 2017, 14 pages.

Ye et al., "Omnidirectional, polarization-insensitive and broadband thin absorber in the terahertz regime," *J. Opt. Soc. Am. B*, 27:498-504 (Mar. 2010).

* cited by examiner

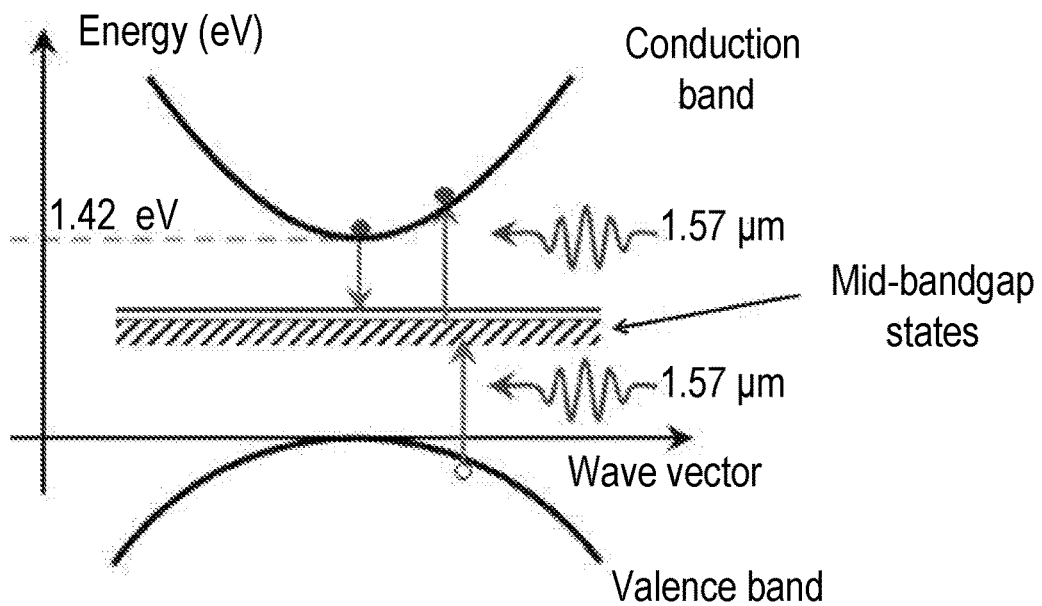
FIG. 3
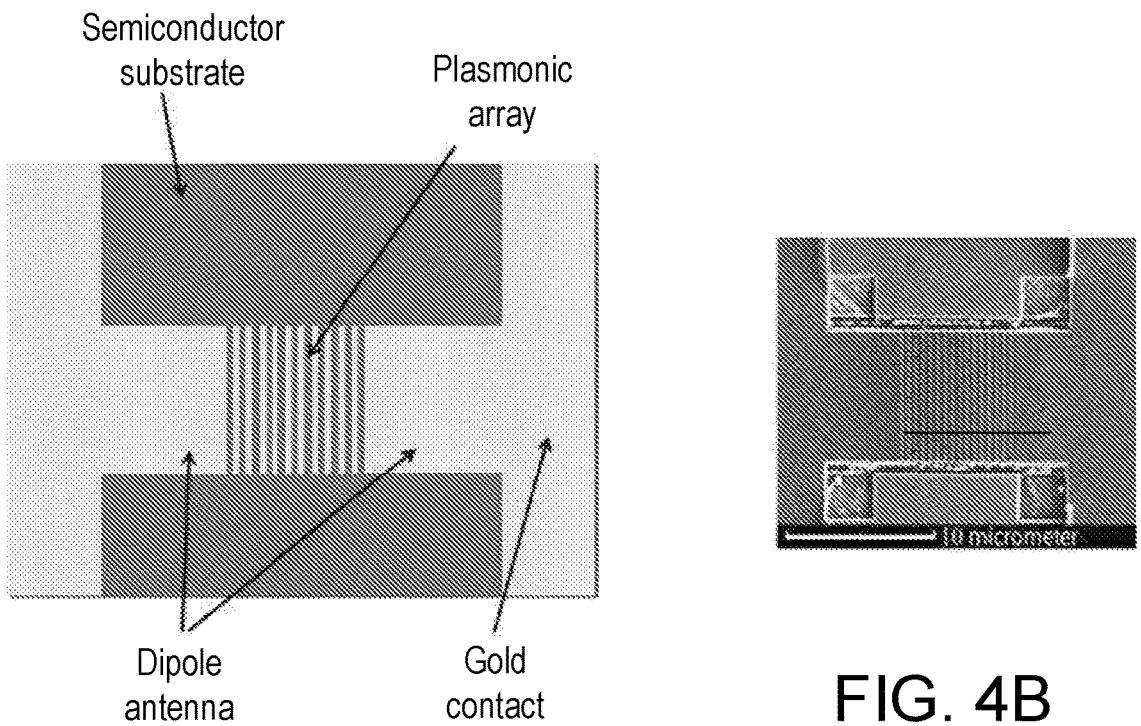
FIG. 4A
FIG. 4B

PLASMON-ENHANCED BELOW BANDGAP PHOTOCONDUCTIVE TERAHERTZ GENERATION AND DETECTION

CROSS REFERENCE TO RELATED APPLICATIONS

This is the U.S. National Stage of International Application No. PCT/US2016/061874, filed Nov. 14, 2016, which was published in English under PCT Article 21(2), which in turn claims the benefit of U.S. Provisional Application No. 62/254,915, filed Nov. 13, 2015. The provisional application is incorporated herein in its entirety.

FIELD

The disclosure pertains to generation, transmission, and detection of signals at THz frequencies, with potential applications in spectroscopy, biomedical analysis, analysis of substances and materials, and communications.

BACKGROUND

Terahertz (THz) systems and technology have become important for a wide variety of applications in analysis, diagnostics, and communications. A large number of significant technical innovations over the last decade have made the terahertz frequency range (0.1 to 10 THz) increasingly accessible for applications in science and industry. However, difficulty in generating, manipulating, and detecting terahertz radiation continues to plague most applications. Source powers (from sources that are readily attainable) tend to be low. Focusing optics are costly, difficult to align, and have high loss. Detectors are expensive, inefficient (particularly at high frequencies), and usually require alignment with an optical pump source. In combination, these factors restrict terahertz applications to exploratory and scientific investigation, rather than to what could become large markets for relatively high-volume applications.

One of the most common applications for THz technology is spectroscopy. In spectroscopy, the frequency dependence of transmission of electromagnetic radiation through a sample reveals a unique fingerprint of the substances being studied. In the THz frequency range, this fingerprint results from unique rotational and vibrational energy states associated with complex molecules, providing information related to composition and conformal state. While other approaches (e.g. Raman), offer views into molecular form and function, THz spectroscopy provides a unique and complementary view. As a result, an easy to use and cost-effective THz spectrometer will stimulate environmental, medical, material science, and other applications.

Both time-domain spectrometers (TDS) and frequency-domain spectrometers (FDS) are well established. At the heart of each, as shown by the dotted lines in FIG. 1, is a THz generation-analysis-detection (TGAD) module 100. In a typical TDS, a short laser pulse (50 fs) is split and focused on separate transmit and receive photomixers (PM) 110. The terms photomixer and photoconductive switch (PCS) are generally used in reference to FDS and TDS operation, respectively. Within this document and in the claims, it is understood that the terms PM and PCS are applicable to both modes of operation. The transmit PM is biased such that the change in conductivity induced by absorption of the short optical pulse (TDS) or high-frequency modulation component (FDS) creates a corresponding current transient that drives a small dipole antenna, radiating THz frequencies that are captured by a silicon lens 120 to produce a diverging THz beam 130. A Teflon lens, or alternatively a metallic focusing reflective optical element, 140 then creates a collimated THz beam region 150 in which a sample can be situated. After passing through a sample, the THz beam is delivered to the receive PM where it is sampled by the short laser pulse (TDS) to produce a small current as measured typically with a lock-in-amplifier. In order to accurately sample the received THz signal, the receiver PM must possess an extremely short carrier lifetime, such that sampling signal is approximately a delta function or impulse in time. For this reason, low-temperature grown (LT) GaAs is usually used for the PMs, in which defects within the crystal lattice provide rapid carrier recombination. The sampling time is adjusted using a variable optical delay, in this case introduced by varying a retro-reflector. FDS operate in the same manner except that instead of using a short laser pulse, two continuous-wave lasers separated in optical frequency by the THz frequency are combined to produce the THz pump intensity variations. THz pump intensity variations could also be generated, in principle, using a broadband optical source like a super-luminescent diode or amplified spontaneous emission source.

Other methods of system operation have been demonstrated. For example, it is not necessary to use PCS devices at the detector. Other nonlinear optic detection methods, in particular using electro-optic crystals have been studied. For example, using the Pockel's effect, a nonlinear crystal with high electro-optical coefficient, such as ZnTe, undergoes induced birefringence when a THz beam propagates inside the crystal. This changes the polarization of a co-propagating probe beam from circular to elliptical, changes that can be detected using a Wollaston beam splitter and a differential photo detector pair.

Many applications for THz analysis have been defined, including measurement of gas-phase samples, liquids and solids. Examples include non-invasive diagnostics of disease by detecting volatile compounds in breath, such as ethanol ($C_2H_5OH$) for law enforcement, hydrogen for carbohydrate metabolism, nitric oxide (NO) for asthma, carbon monoxide (CO) for neonate jaundice, $^{13}CO_2$ for H. pylori infection (related to stomach cancer and normally asymptomatic), and branched hydrocarbons for heart transplant rejection. Additionally, increased breath ammonia ($NH_3$) is found to relate to kidney and liver dysfunction, breath acetone is higher in diabetes, and the level of aldehydes such as methanol ($CH_2O$) can be used to screen lung and breast cancers. Currently applied analytical instruments include mass and mid-IR spectrometers. Although these are large and expensive, both are in widespread use, supporting diverse instrumentation and diagnostic industries. THz spectrometers can record fast processes, opening up a unique potential for real-time analysis of exhaled air.

In security, several applications exist in the area of explosive detection, where flames, plumes, and explosive vapour are of great interest. Collective motions in molecules found in common explosives correspond to features in THz spectra that can be used for unique identification. There have been extensive studies on the THz spectroscopy of explosives like DNT, RDX, HMX, TNT, and PETN[10].

Environmental applications include measurement of rotational transitions of light polar molecules and low-frequency vibrational modes of large molecular systems, both of which can be probed by THz spectroscopy, opening applications in sensing atmospheric pollutants and detecting airborne chemicals. Atmospheric pollutants like hydrogen sulphide (H2S), OCS, formaldehyde (H2CO), and ammonia (NH3) possess intense THz transitions. Volatile organic compounds (VOCs) are of high interest in manufacturing and oil and gas industries, and are potentially detectable in real time using THz technology.

Finally, large numbers of applications have been considered within the laboratory, including studying the absorption and dispersion of compounds, real-time trace gas detection, and the analysis of chemical compositions.

THz generation-analysis-detection (TGAD) modules used in existing THz spectrometers (FIG. 1) use photomixers (PM) or photoconductive switches 110 to generate and receive THz radiation. FIG. 2 illustrates a detailed view of the PCS in the configuration of a typical photoconductive antenna (PCA) 210. The PCA comprises a PCS 211 and patterned metallic circuit 212, and is generally fabricated on a direct-band-gap semiconductor (low-temperature GaAs or InGaAs) substrate 213. The PCS utilizes photoconductivity of a semiconductor to generate free electrons and holes or photocurrent under intense laser illumination. The fast rise of the photocurrent resulting from the absorption of rapidly varying optical pump intensity, together with a short carrier lifetime of these photo-generated carriers, result in conversion of ultra-high speed pump intensity modulation into a corresponding THz modulation of the PCS conductance. At a transmitter, a bias voltage (e.g., 10 V) is applied across a small, typically a few µm, gap 211 in the conductive cap layer. The current through this gap is modulated by the modulation of the PCS conductance and the modulated current is radiated by the short dipole antenna (214). In the absence of light the semiconductor has a very low conductivity. This reduces the dark current and heat generated by the dark current. Lower dark conductivity allows more charges to build up at greater bias voltages while maintaining thermal stability. Upon the arrival of a femtosecond optical pulse the generated current between arms of the dipole antenna or the active area is proportional to the biased field and conductivity of the material. The current surge generates an electromagnetic burst with THz frequency components. Due to the high refractive index of the semiconductor substrate, radiation from the antenna is typically greatest through the substrate, and the THz beam 130 is collected from the back of the PCA chip. Many alternative antenna structures have been demonstrated in addition to the simple dipole of FIG. 2, each with unique properties.

The same PCA can be configured as a receiver when it is electrically connected to a lock-in amplifier (FIG. 1). In this case no DC bias is used. Rather, the received THz signal biases the PCS causing current to flow across the gap. This is sampled using a replica of the transmitter pump pulse, such that a signal proportional to the received THz signal is detected by the lock-in. The delay line (FIG. 1) shifts the position of the sampling THz pulse and provides discrete time samples proportional to the amplitude of the THz electric field. A real-time THz frequency spectrum is obtained by taking a Fourier transform of the sampled THz pulse.

The present disclosure addressing the above shortcomings and provides approaches that can realize improvements in power and efficiency of photoconductive switches. Such improvements will be essential in making THz measurement practical.

BRIEF DESCRIPTION OF THE DRAWINGS

FIG. 3 is a schematic of a two-step 1.57 µm photon absorption process enabled by mid-gap states in arsenic-rich LT-GaAs.

FIGS. 4A-4B illustrate a photoconductive dipole antenna including a representative resonant plasmonic structure in an antenna gap (FIG. 4A), an associated electron microscope image, of a plasmonic photoconductive switch with 100 nm gaps and a 490 nm period (FIG. 4B).

SUMMARY

Figure 1:
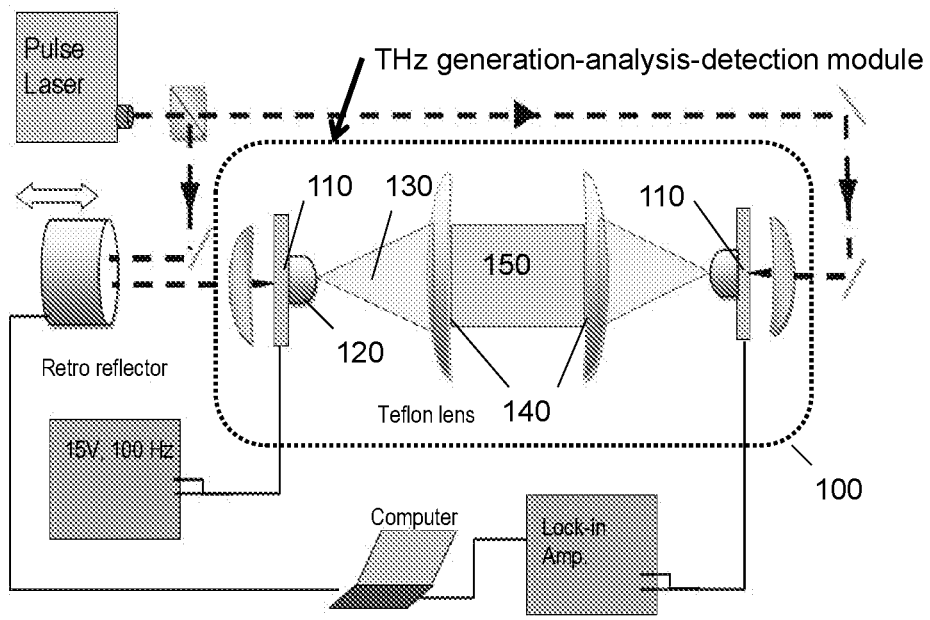
FIG. 1 illustrates a representative time-domain THz spectrometer.

Terahertz radiation systems comprise a photoconductive switch situated on a semiconductor substrate, wherein the photoconductive switch includes a plasmonic resonance structure. An optical pump source is situated to direct a pump beam having photon energy corresponding to one half of a band gap energy of the semiconductor substrate to the plasmonic resonance structure. Typically, the plasmonic resonance structure is selected to enhance a local field intensity produced in response to the pump beam. In some examples, the plasmonic resonance structure is configured based on the pump beam photon energy so as to increase a magnitude of a local field intensity in a region of the semiconductor substrate proximate the plasmonic resonance structure. In typical examples, the photon energy of the pump beam is between 0.4 and 0.6 times the band gap energy of the semiconductor substrate. In some alternatives, the plasmonic resonance structure includes a one dimensional or two dimensional array of conductor portions having a period selected based on a wavelength of the pump beam in the in the semiconductor substrate. In some examples, the period is between 100 nm and 750 nm, 50 nm and 2 µm, or 20 nm and 800 nm. The plasmonic structure is generally selected to maximize or provide increased field proximate the plasmonic structure in the semconductor substrate produced by the pump beam. In most cases, "proximate" refers to regions in the semiconductor substrate that are within 1, 2, 5, or 10 periods of the plasmonic resonance structure. In some embodiments, this corresponds to a volume defined by an area of the plasmonic resonace structure on the semiconductor structure to a depth of 100 nm to about 10 µm.

According to some examples, the semiconductor substrate comprises a plurality of epitaxially deposited semiconductor layers and the plamonic resonance structure includes a periodically patterned conductor having a period that is less than a period of the pump beam. In still further examples, the system includes a first electrode and a second electrode coupled in series to the periodically patterned conductor of the plasmonic resonance structure so that features of the periodic conductor pattern divide a total voltage between the first electrode and the second electrode so that a portion of the total voltage is applied across each of the periodic features of the periodic pattern. In some particular examples, the period is between 100 nm and 1 μm. In still other embodiments, the plasomic resonance structure is selected to control reflection of the pump beam and the semiconductor substrate includes a dopant situated proximate at least the plasmonic resonance structure so as to absorb the pump beam. According to representative embodiments, the optical pump source is a mode-locked laser, one or more continuous-wave lasers, or a broadband optical source.

Systems for generating and receiving terahertz signals include two photoconductive switches defined on semiconductor substrates and situated to receive two optical pump beams, wherein at least one of the photoconductive switches comprises a plasmonic resonance structure selected based on a wavelength associated with at least one of the two optical pump beams so as to provide an associated local field intensity at at least one of the two photoconductive switches. At least one of the optical pump beams has a photon energy corresponding to about one-half of a band gap energy of at least one of the semiconductor substrates. In some examples, an optical pump source is operable to produce the two optical pump beams based on splitting of a common optical beam. In other examples, the two photoconductive switches are optically coupled such that a terahertz signal transmitted from a first photoconductive switch of the two photoconductive switches is received by a second photoconductive switch of the two photoconductive switches. In still further examples, a sample to be analyzed is situated within an optical path between the two photoconductive switches. In some cases, the semiconductor substrates comprise a plurality of epitaxial semiconductor layers and the plasmonic resonance structure includes a periodic nanostructured patterned metal having a period less than a wavelength associated with the two optical pump beams. In representative embodiments, the periods of the periodic nanostructured patterned metal are arranged so that a total voltage across the periodic nanostructured patterned metal is divided across each of the periods. Typically, the periodic nanostructured patterned metal is selected so as to control reflection of the optical pump beams, and a single semiconductor substitute is used and includes a dopant having a concentration so as increase absorption of the pump beams by the two photoconductive switches. In other examples, a mode-locked laser, at least two continuous-wave lasers, or at least one broadband optical emission source are situated to produce at least one of the two optical pump beams.

Systems for generating or detecting terahertz signals include a photoconductive switch that includes a semiconductor substrate and a plasmonic resonance structure defined on the semiconductor substrate. The plasmonic resonance structure generally includes a periodic nanostructure-patterned conductor having an array of pattern elements having a pattern period that is less that a wavelength of the optical pump beam. First and second electrical contacts are coupled to opposing sides of the periodic nanostructure-patterned conductor such that a voltage at the first and second electrodes is divided by periods of the array of pattern elements. An optical pump source directs a pump beam to the periodic nanostructure-patterned conductor of the photoconductive switch, the pump beam having a photon energy corresponding to about one-half of a band gap energy of the semiconductor substrate. The periodic nanostructure-patterned conductor is configured to direct the pump beam into the semiconductor substrate and produce an associated electric field proximate the periodic nanostructure-patterned conductor, and preferably to increase or maximize the electric field.

Methods for generating terahertz signals comprise directing an optical pump beam to a plasmonic resonance structure on a semiconductor substrate, the optical pump beam having a photon energy corresponding to one-half of a band gap energy of the semiconductor substrat. The plasmonic resonance structure generally comprises an array of conductive regions. A bias voltage is applied across the photoconductive switch, wherein the array of conductive regions divides a voltage applied across the switch between each of the elements of the array.

Methods comprise selecting an optical pump wavelength corresponding to about one-half a band gap of a semiconductor substrate and selecting a plasmonic structure period based on the optical pump wavelength and the semiconductor substrate. A plasmonic structure having the selected plasmonic structure period is then defined on the semiconductor substrate. In some examples, the plasmonic structure is selected to enhance an electrical field associated with an optical pump beam at the optical pump wavelength proximate the defined plasmonic structure on the semiconductor substrate. In further examples, a semiconductor substrate doping is selected to enhance an electrical field associated with an optical pump beam at the optical pump wavelength proximate the defined plasmonic structure on the semiconductor substrate.

These and other features of the disclosed technology are set forth below with reference to the accompanying drawings.

DETAILED DESCRIPTION OF THE INVENTION

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description some-times uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

In what follows, the term photomixer refers to any photoconductive device used with either a pulsed or continuous wave laser source to generate currents with terahertz frequency components. The term terahertz frequency band refers to the region of the electromagnetic spectrum ranging between 100 GHz and 10 THz. Plasmonic, in this context, refers to the use of nanostructured metal to focus or concentrate light to below the diffraction limit The disclosure pertains to methods and apparatus that can combine, improve, and/or optimize mid-band absorption through semiconductor processing engineering and using plasmonic enhancement to increase or maximize local fields of pump wavelengths near a middle of a material band gap (e.g. 1550 nm using plasmonic structures on LT-GaAs.)

At present, the vast majority of THz systems operate at optical wavelengths near 800 nm using GaAs-based semiconductors. It is widely accepted that laser systems developed for high-volume optical communications applications offer cost advantages over lower-volume technologies, and that these lasers and components operating at wavelengths near 1550 nm are key to developing portable and low-cost THz systems. However, THz systems operating near 1550 nm are generally less efficient than those at 800 nm. Therefore, there is a need to develop higher efficiency and higher-power photoconductive switches that operate at wavelengths near 1550 nm.

Semiconductors such as InAs, InSb and GaSb are very conductive leading to problems with high dark current. InAs THz transmitters were proposed based on photo-Dember effect which only utilizes higher mobility of the electrons to generate space charge dipoles. InGaAs is a well-known available photoconductive material but yet the small bandgap, low resistivity and slower carrier response of these 1550 nm PCAs limit the performance in terms of output power and bandwidth. In order to decrease the conductivity, a stack of 100 layers multi quantum well InGaAs/InAlAs has been used but fabrication is complex and performance mediocre. Short-carrier-lifetime beryllium-doped InGaAs and Er:InGaAs have also been studied. However, complexity of fabrication increases total cost of these devices. Currently InGaAs photoconductive switches are several times more expensive than comparable LT-GaAs devices. There is a compelling need to improve upon the state of the art.

It has been recognized that LT-GaAs can be used to absorb 1.55 μm light by means of mid-gap arsenic states. LT-GaAs has a bandgap energy of 1.42 eV, corresponding to roughly 870 nm. Thus, it is almost transparent at 1.55 μm light. Arsenic antisites are formed during molecular beam epitaxy (MBE) growth at low growth temperatures (LT-GaAs) and present EL2 energy levels in range of 0.6 eV to 0.8 eV, inclusive of the mid-gap energy of GaAs. This corresponds to the photon energy of wavelengths of 1.55 μm. Unlike a direct transition from valance to conduction bands, absorption of a photon with a wavelength of 1.55 μm promotes a carrier only to this mid-gap state. Absorption of a second photon then promotes the electron to the conduction band. This process is plotted in FIG. 3. Because arsenic mid-gap states are also recombination centers, the 1.55 μm laser intensity has to be high enough to initiate a two-step transition. Studies have shown that this two-step transition is nonlinearly dependent on laser power, but that this nonlinearity saturates for high pump powers of interest such that the resulting absorption is approximately linear like the absorption for photon energies exceeding the bandgap energy, but weaker. Therefore, absorption for these mid-gap states is not conventionally considered to be sufficiently high for use in THz transceivers. Rather, materials are generally paired with pump lasers operating at photon energies exceeding the bandgap energy (e.g. LT-GaAs for operation with wavelengths near 800 nm.)

Light-matter interaction in nanoscale devices or structures has been investigated previously. Plasmonic nanostructures have been demonstrated that provide significant potential in enhancing generation and detection of THz radiation by more efficiently coupling light into the semiconductor. Furthermore, plasmonic gap structures provide superior thermal management and maximize the local electrical field between resonating electrodes. Typically, these structures comprise a number of conductive metallic fingers, dots, or other periodic geometric features such as conductive particles, crosses, wires, rectangular or ovoid conductors arranged on the surface of a semiconductor such that light is allowed through the gaps between the features. The period of the repeating pattern of features is selected to be approximately equal to the wavelength of light in the material on the surface. Interaction between the light and metal creates resonant surface plasmons that can in turn focus light through the very small and typically sub-wavelength gaps. Hence one can achieve high optical transmission through a largely metallic surface, and some designs appear to provide transmittances of at least 40% or 80%.

The electric field of an optical pulse in the sub-wavelength gaps on the conductive surface structure of a resonant plasmonic structure can be greater than that of a large gap (e.g. >2 μm) structure. Therefore, more carriers are generated closer to the electrodes where they can contribute to a sub-picoseconds response time. Without plasmonic enhancement, the electron saturation velocity of $1.27 \times 10^5$ m/s and short carrier lifetime of LT-GaAs limit the number of carriers that contribute to conductivity as it is less likely that carriers generated a few hundred nanometers depth from the surface participate in conductivity before being trapped and recombining. As a result, plasmon-enhanced THz transmitters and receivers have shown improved amplitude response and bandwidth. However, challenges remain in defining appropriate plasmonic devices for low-cost and high-performance systems. Operation at wavelengths near 800 nm is subject to the high cost of laser pump systems, and operation at 1550 nm is limited by the factors described above, compounded by the high dark currents resulting from very small features and gaps required to achieve plasmonic resonances.

However, absorption efficiency for these mid-gap states is low. In some disclosed examples, applying plasmonic enhancement for the mid-gap absorption process associated with LT-GaAs with 1.55 μm laser sources produces improved performance A further aspect is to optimize the growth conditions of the semiconductor to increase or maximize mid-gap absorption. Some results have shown plasmon-enhanced LT-GaAs (PE-LT-GaAs) photoconductive switches with twice the peak-to-peak current and three times the bandwidth of current commercial InGaAs devices.

The disclosed plasmonic devices can use even greater bias voltages than conventional devices as a voltage drop is staggered across the multiple periods of the device. In particular, using the disclosed approaches, voltages of up to ~118V have been demonstrated.

Figure 2:
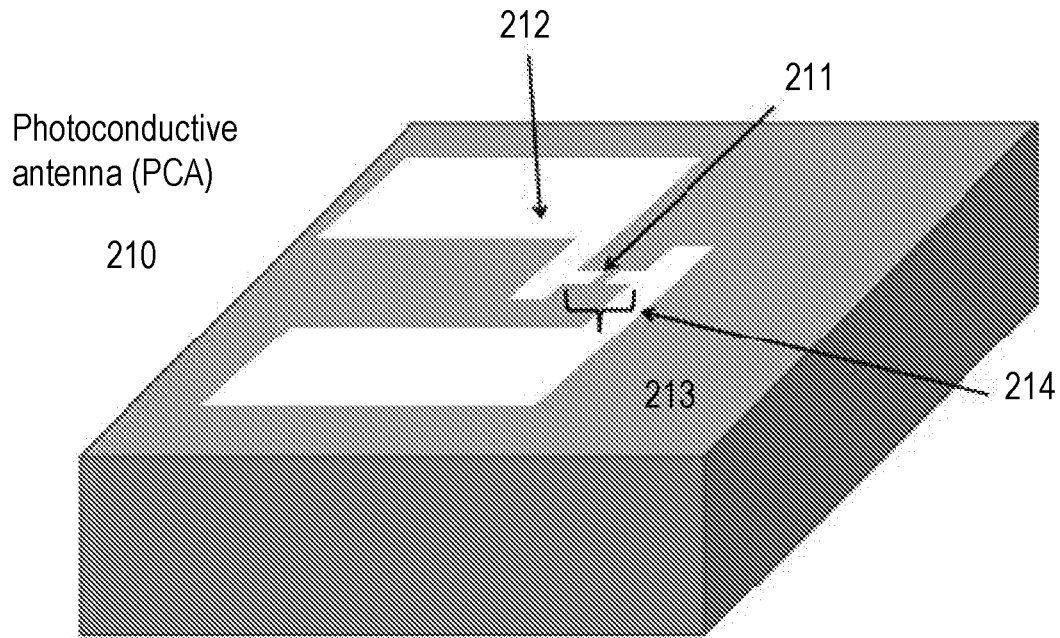
FIG. 2 illustates a representative photoconductive antenna.

FIG. 4A shows a sketch of a representative plasmonic PCA device (enlarged from the region near 214 in FIG. 2) and a corresponding scanning electron microscope image of a tested photoconductive PCA is shown in FIG. 4B. The latter consists of a 2 μm thick LT-GaAs photoconductive layer grown on a semi-insulating GaAs substrate at a growth temperature of 226 Celsius. Annealing was done at 630 Celsius for 1 minute to reduce the carrier lifetime and maximize the resistivity of the LT-GaAs. A 15 μm long dipole antenna was patterned on the surface of LT-GaAs using photolithography and fabricated using a 5 nm titanium adhesion layer followed by a 150 nm gold film deposited by e-beam evaporation.

Mid-gap absorption arises because of LT-GaAs defect states. It is then desirable to maximize the number of defect states, which is accomplished by maximizing the incorporation of arsenic during growth. Typically, growth with a ratio of excess Ase to Ga of greater than 20, 10, 4, or 2 is used. It is also envisioned that thinner layers can be made with higher excess ratios, allowing for more arsenic defects and hence more absorption. This is particularly well suited for the plasmonic enhancement done here, since most of the absorption occurs within the 100 nm closest to the surface, and so growing thinner layers with more defects becomes advantageous. For example, layer thicknesses can range from 50 nm to 100 μm, or other thicknesses.

Annealing is used to allow arsenic clusters to form from arsenic defects in the lattice. Without annealing the LT-GaAs is very conductive, which increases dark current. If annealing is done for too long, the arsenic clusters merge together and migrate to the crystal surface exiting the lattice. This has negative impact on both absorption for mid-gap states and carrier lifetime, which as discussed previously must be short. At wavelengths above 1500 nm, both annealed and un-annealed (as-grown) LT-GaAs show the same absorption from the mid-gap states, and this is significantly higher than GaAs. Therefore, annealing is preferred to provide good absorption, short lifetime, and low dark current.

Design parameters for the plasmonic structure were selected using commercially available Lumerical finite-difference time-domain simulation software. Periodicity was swept from 100 nm to 1500 nm and the gold thickness from 100 to 150 nm with the goal of maximizing the field intensity into the substrate at a fixed 100 nm gap width. Johnson & Christy and Palik permittivity values were used for gold and GaAs, respectively. A periodicity of 490 nm resulted in maximum field intensity inside the substrate with gold thickness of 150 nm and a source wavelength of 1.57 μm (center wavelength of an existing laboratory femtosecond laser).

The plasmonic structure slit array was milled a using a Hitachi FB-2100 Focused Ion Beam system using dimensions obtained from simulation. Eighteen periods of the array were chosen to have an approximately square active region for optical excitation (considering the width of the bridge was around 10 μm). A trench was milled around the dipole to eliminate extraneous short-circuit paths. An etch solution of (1:1, HCL: H2O) was used to remove excess gallium deposited by the ion beam[23].

Figure 5:
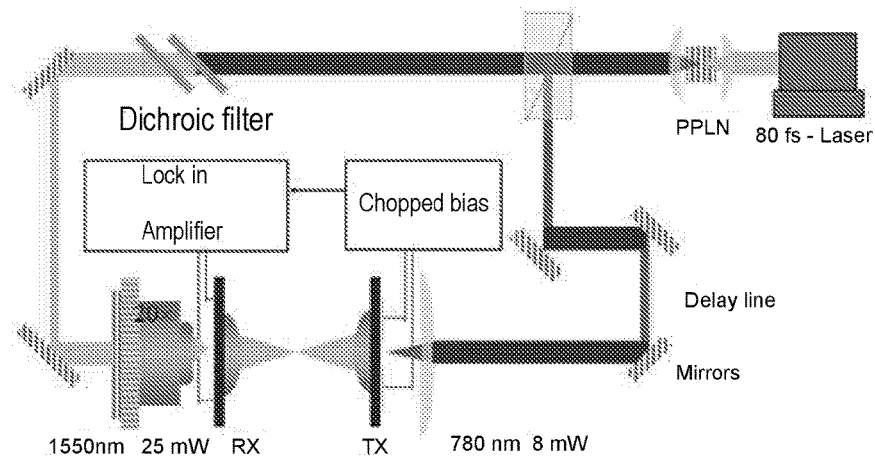
FIG. 5 is a representative experimental arrangement for THz radiation detection using a 1570 µm femtosecond laser to excite carriers in photoconductive switches based on InGaAs, LT-GaAs, and/or PE-LT-GaAs.

FIG. 5 shows a schematic of a representative THz experimental demonstration. For characterization purposes, we relied on second-harmonic generation in a periodically-poled lithium niobate crystal and a commercial LT-GaAs photoconductive switch for the THz source (BATOP, PCA-40-05-10-800-a). This was done to provide a well understood high-bandwidth high-power THz source. However, all the receiver devices were pumped only with 1.57 μm wavelength femtosecond light pulses (as ensured by dual long-pass filters—Edmund Optics 950 nm dichroic filter). The transmitter was biased according to specifications (chopped for lock-in detection) and the receivers were each directly connected to the lock-in amplifier.

Figure 6A:
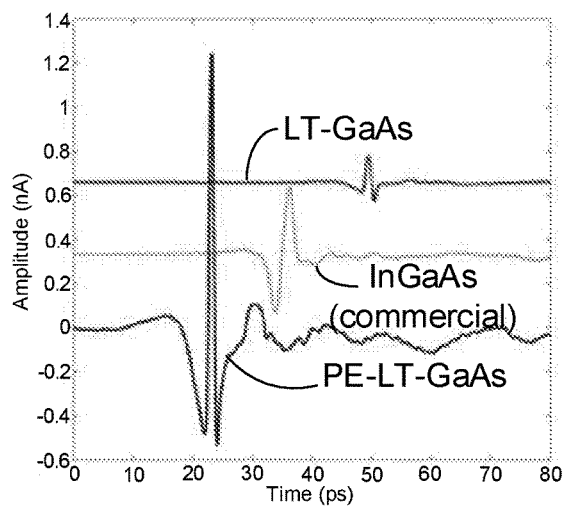
FIG. 6A-6B illustrate time domain THz driven current detected at receiver (FIG. 6A) and power spectra of THz responses obtained from results of FIG. 6A, wherein curves for different materials are offset for clarity.
Figure 6B:
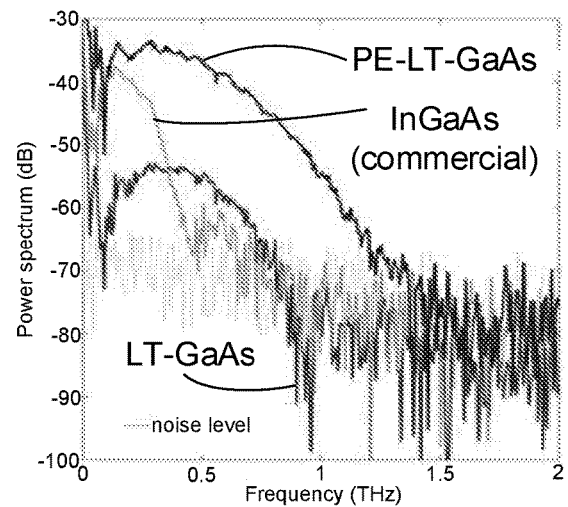

FIG. 6A shows the THz-driven photocurrent detected at the receiver for three separate PCAs: a commercial InGaAs PCA (BATOP, PCA-40-05-10-1550-a), an LT-GaAs dipole with 5 μm gap, and a PE-LT-GaAs device as shown in the SEM image of FIG. 4B. The curves are offset for clarity. It is clear from this figure that the PE-LT-GaAs device has a sharper and higher peak response than the commercial device for the same operating conditions. It is interesting to note that our devices do not have any antireflection coatings, which are used in the commercial devices to improve optical coupling. FIG. 6B shows the power spectrum of these photoconductor receivers, showing that the bandwidth is three times larger for the PE-LT-GaAs device as compared to the commercial sample. Since the bandwidth may be improved by further averaging to lower the noise floor, the frequency roll-off is also an important characteristic. Here we obtain a roll-off that is typically better than the 20 dB/THz obtained in commercial InGaAs devices (also those provided by other vendors). This shows the benefit of using LT-GaAs in these applications due to its superior material response characteristics. The usual water absorption lines are seen in the power spectrum (denoted with vertical dashed lines in FIG. 6B) since the experiment was performed in ambient conditions.

Figure 7A:
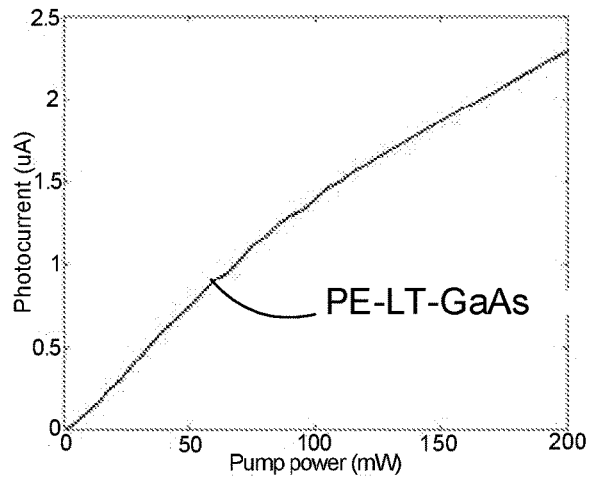
FIGS. 7A-7B illustrate photocurrent of a PE-LT-GaAs device under 1.57 µm optically amplified laser excitation, wherein the device was biased at 1 V DC during the measurement and a pump-power dependence of peak-to-peak THz signal of three devices of different materials. The inset of FIG. 7B shows a 1.35 power dependence of LT-GaAs up to a saturation of mid-gap states.
Figure 7B:
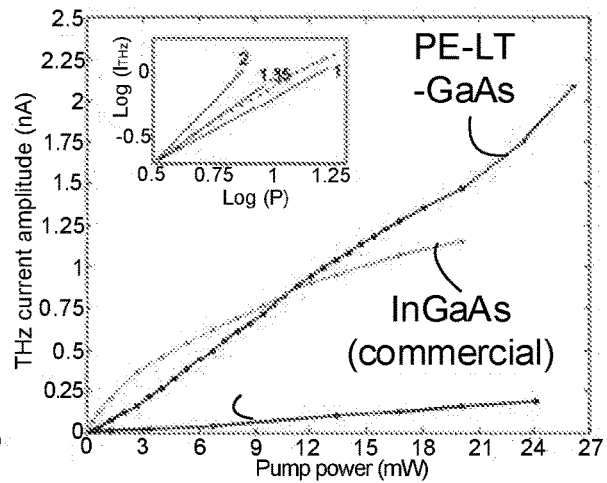

While it is clear that the PE-LT-GaAs device shows improved performance up to 25 mW pump power, it is important to note that this is well below the saturation power or damage threshold for this device. The InGaAs commercial device begins to saturate below 20 mW, as shown in FIG. 7B. In contrast, the LT-GaAs and PE-LT-GaAs devices do not show saturation up to 25 mW. We increased the pump power to 200 mW using an external erbium-doped fiber amplifier and still did not see saturation (FIG. 7A). However, this external amplifier degrades the pulse width and so it was not used in THz generation/detection. Nevertheless, this shows the potential of these devices to operate using commercially available higher-power femtosecond 1.5 μm devices. The high power potential of these PE-LT-GaAs devices is enabled by three factors: the lack of direct bandgap absorption, the lower absorption from the gold at 1.5 μm (as compared to 800 nm), and the fast heat dissipation by the adjacent gold material. We also note that there is an initial superlinear dependence observed for low powers in the PE-LT-GaAs and LT-GaAs devices (FIG. 7B). This is expected from the two-stage absorption process before the saturation of the mid-gap states.

Finally, we investigated the performance of these devices as THz sources. The LT-GaAs and PE-LT-GaAs samples were biased at 20 V and the InGaAs device was biased at 3V (following the specification sheet). The higher bias is allowed in LT-GaAs devices due to the higher resistivity. Overall, similar performance enhancements as for the receiver are seen for the PE-LT-GaAs photoconductive source with respect to the commercial InGaAs device and the LT-GaAs dipole, as shown in FIGS. 6A-6B.

Rather than radiating the generated THz signals from an antenna, like the dipole used in this demonstration, the generated THz can be coupled into a THz waveguide. This may offer advantages on packaging and performance. Waveguide-coupled PE-LT-GaAs photoconductive switches may provide cost effective transceivers for 1.55-μm-based THz waveguide systems. A waveguide based THz system at 1.55 μm is robust against vibration and misalignment because it uses fiber-based laser guiding and focusing to the active area and a rigid THz waveguide. The combination of PE-LT-GaAs PCSs and THz waveguides paves the wave to industrialization of cost effective portable THz systems.

Figure 8:
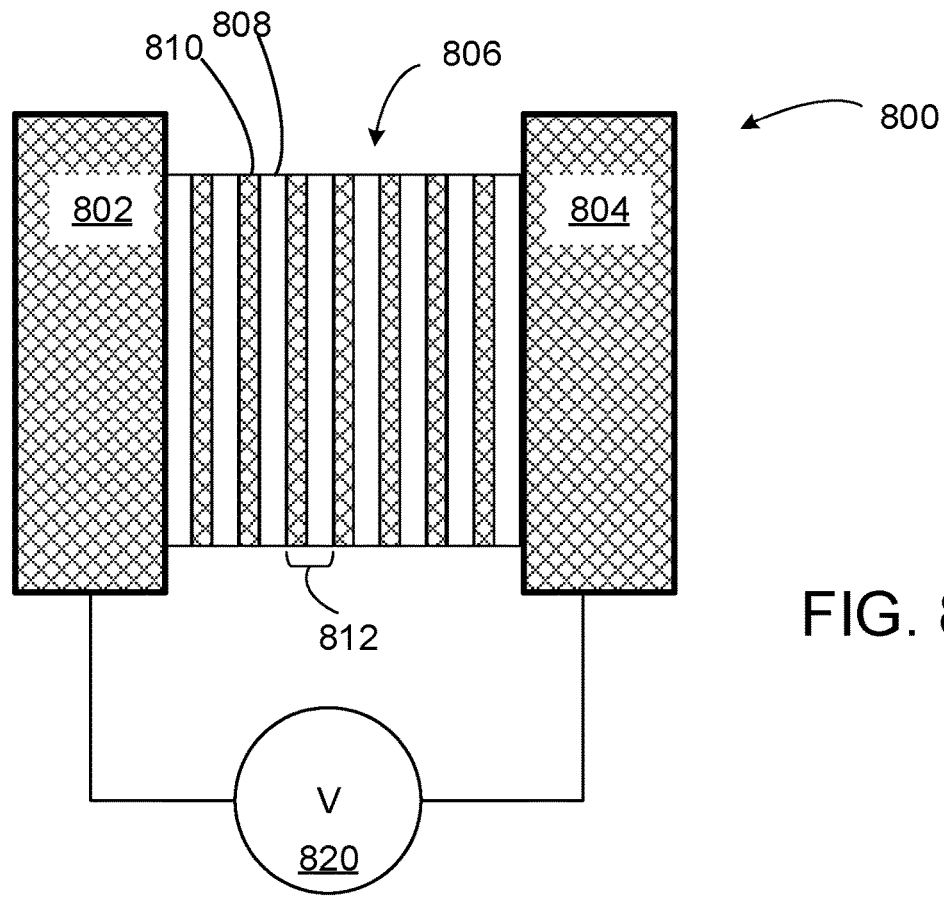
FIG. 8 illustrates voltage division across periods of a periodic plasmonic resonance structure.

FIG. 8 illustrates a plasmonic resonance structure 800 that includes electrodes 802, 804 coupled to a period array 806 of gaps such as a gap 808 and electrode fingers such as an electrode finger 810. A single period 812 of this 8-period example is illustrated. A voltage applied to the array 806 by a voltage source 820 is divided by the gaps. If an array includes N gaps (N periods), a voltage of about 1/N of the applied voltage appears across each period of the array.

In view of the many possible embodiments to which the principles of the disclosed technology may be applied, it should be recognized that the illustrated embodiments are only representative examples and should not be taken as limiting the scope of the disclosure.

We claim:

1. A terahertz radiation system comprising: a photoconductive switch situated on a semiconductor substrate, the photoconductive switch including a plasmonic resonance structure; and an optical pump source situated to direct a pump beam having photon energy corresponding to about one half of a band gap energy of the semiconductor substrate to the plasmonic resonance structure of the photoconductive switch, wherein the plasmonic resonance structure increases a magnitude of a local field intensity proximate the plasmonic resonance structure produced directly in response to photons of the pump beam.

2. The system of claim 1, wherein the plasmonic resonance structure includes a one or two dimensional periodic array of conductor portions having a period based on the pump beam photon energy.

3. The system of claim 1, wherein the photon energy of the pump beam is between 0.4 and 0.6 times the band gap energy of the semiconductor substrate.

4. The system of claim 1, wherein the plasmonic resonance structure includes an array of conductor portions having a period selected based on a wavelength of the pump beam.

5. The system of claim 4, wherein the period is selected based on the wavelength of the pump beam in the semiconductor substrate.

6. The system of claim 1, wherein the period is between 100 nm and 750 nm.

7. The system of claim 1, wherein the semiconductor substrate comprises a plurality of epitaxially deposited semiconductor layers.

8. The system of claim 1, wherein the plasmonic resonance structure includes a periodic conductor pattern having a period that is less than a free space wavelength of the pump beam.

9. The system of claim 8, further comprising a first electrode and a second electrode coupled in series to the periodic conductor pattern of the plasmonic resonance structure so that periodic features of the periodic conductor pattern divide a total voltage between the first electrode and the second electrode so that a portion of the total voltage is applied across each of the periodic features of the periodic pattern.

10. The system of claim 4, wherein the period is between 100 nm and 1 μm.

11. The system of claim 1, wherein the plasmonic resonance structure is selected to control reflection of the pump beam.

12. The system of claim 1, wherein the semiconductor substrate includes a dopant situated proximate the plasmonic resonance structure so as to provide increased pump beam absorption.

13. The system of claim 1, wherein the optical pump source is a mode-locked laser.

14. The system of claim 1, wherein the optical pump source comprises first and second continuous-wave lasers, and the optical pump beam includes a first pump beam and a second pump pump associated with the first and second continuous-wave lasers, respectively.

15. The system of claim 1, wherein the optical pump source is a broadband optical source.

16. A system for generating and receiving terahertz signals, comprising two photoconductive switches defined on at least one semiconductor substrate and situated to receive respective optical pump beams, wherein at least one of the photoconductive switches comprises a plasmonic resonance structure selected based on a wavelength associated with at least a selected one of the optical pump beams so as to increase an associated local field intensity at at least one of the two photoconductive switches directly in response to photons of the selected optical pump beam, wherein the selected optical pump beam has a photon energy corresponding to about one-half of a band gap energy of the at least one semiconductor substrate.

17. The system of claim 16, further comprising an optical pump source operable to produce the optical pump beams based on splitting of a common optical beam.

18. The system of claim 16, wherein the two photoconductive switches are optically coupled such that a terahertz signal transmitted from a first photoconductive switch of the two photoconductive switches is received by a second photoconductive switch of the two photoconductive switches.

19. The system of claim 16, further comprising a sample to be analyzed situated within an optical path between the two photoconductive switches.

20. The system of claim 16 wherein the at least one semiconductor substrate comprises a plurality of epitaxial semiconductor layers.

21. The system of claim 16, wherein the plasmonic resonance structure includes a periodic nanostructured patterned metal having a period less than a free space wavelength associated with the two optical pump beams.

22. The system of claim 21, wherein the periods of the periodic nanostructured patterned metal are arranged so that a total voltage across the periodic nanostructured patterned metal is divided across each of the periods.

23. The system of claim 16, wherein the periodic nanostructured patterned metal is selected so as to control reflection of the optical pump beams, and the semiconductor substrate includes a dopant having a concentration so as increase absorption of the pump beams by the two photoconductive switches.

24. The system of claim 16 further comprising a mode-locked laser, at least two continuous-wave lasers, or at least one broadband optical emission source situated to produce at least one of the optical pump beams.

25. A system for generating or detecting terahertz signals, comprising:
   a photoconductive switch that includes a semiconductor substrate and a plasmonic resonance structure defined on the semiconductor substrate, the plasmonic resonance structure including:
      a periodic nanostructure-patterned conductor having an array of pattern elements having a pattern period that is less that a free space wavelength of the optical pump beam;
      first and second electrical contacts coupled to opposing sides of the periodic nanostructure-patterned conductor such that a voltage at the first and second electrodes is divided by periods of the array of patterns of the periodic nanostructure-patterned conductor; and
   an optical pump source situated to direct a pump beam to the periodic nano structure-patterned conductor of the photoconductive switch, the pump beam having a photon energy corresponding to about one-half of a band gap energy of the semiconductor substrate, wherein the periodic nanostructure-patterned conductor is configured to direct the pump beam into the semiconductor substrate and produce an associated electric field proximate the periodic nanostructure-patterned conductor directly in response to photons of the pump beam.

26. The system of claim 25, wherein each pattern element of the array of pattern elements of the periodic nano structure-patterned conductor extends parallel to a common axis and the first and second electrical contacts are situated so that the voltage applied by the first and seconed electrical contacts is applied along an axis perpendicular to the common axis.

27. A method, comprising:
   generating a terahertz signal by directing an optical pump beam to a plasmonic resonance structure on a semiconductor substrate, the optical pump beam having a photon energy corresponding to about one-half of a band gap energy of the semiconductor substrate, wherein the plasmonic resonance structure comprises an array of conductive regions; and
   applying a bias voltage across the photoconductive switch, wherein the array divides a voltage applied across the switch between each of the elements of the array and the terahertz signal is produced directly in reponse to photons of the optical pump beam.

28. A method, comprising:
   selecting an optical pump wavelength corresponding to about one-half a band gap of a semiconductor substrate;
   selecting a plasmonic structure period based on the optical pump wavelength and the semiconductor substrate; and
   defining a plasmonic structure having the selected plasmonic structure period on the semiconductor substrate, wherein the plasmonic structure is selected to enhance an electrical field produced directly in response to photons of an optical pump beam at the optical pump wavelength proximate the defined plasmonic structure on the semiconductor substrate.

29. The method of claim 28, further comprising selecting a semiconductor substrate doping to enhance an electrical field associated with an optical pump beam at the optical pump wavelength proximate the defined plasmonic structure on the semiconductor substrate.

30. The method of claim 29, wherein the semiconductor substrate is arsenic-doped semi-insulating GaAs, and further comprising a dipole antenna situated on a common surface of the semiconductor substrate as the plasmonic resonance structure.

* * * * *